(12) United States Patent
Ando et al.

(10) Patent No.: US 10,971,407 B2
(45) Date of Patent: Apr. 6, 2021

(54) METHOD OF FORMING A COMPLEMENTARY METAL OXIDE SEMICONDUCTOR DEVICE HAVING FIN FIELD EFFECT TRANSISTORS WITH A COMMON METAL GATE

(71) Applicant: INTERNATIONAL BUSINESS MACHINES CORPORATION, Armonk, NY (US)

(72) Inventors: Takashi Ando, Tuckahoe, NY (US); Choonghyun Lee, Rensselaer, NY (US); Pouya Hashemi, Purchase, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 43 days.

(21) Appl. No.: 16/432,346

(22) Filed: Jun. 5, 2019

(65) Prior Publication Data
US 2020/0388544 A1   Dec. 10, 2020

(51) Int. Cl.
*H01L 21/8228* (2006.01)
*H01L 21/8238* (2006.01)
(Continued)

(52) U.S. Cl.
CPC ........ *H01L 21/823828* (2013.01); *H01L 21/28088* (2013.01); *H01L 21/28176* (2013.01);
(Continued)

(58) Field of Classification Search
CPC ......... H01L 21/28176; H01L 21/82285; H01L 21/823431; H01L 21/823487;
(Continued)

(56) References Cited

U.S. PATENT DOCUMENTS 7,696,036 B2    4/2010  Bu et al.
8,268,689 B2    9/2012  Guo et al.
(Continued)

OTHER PUBLICATIONS

Ando et al., "Simple Gate Metal Anneal (SIGMA) Stack for FinFET Replacement Metal Gate toward 14nm and beyond", 2014 Symposium on VLSI Technology Digest of Technical Papers, Jun. 2014, 2 pages.
(Continued)

*Primary Examiner* — Hoai V Pham
(74) *Attorney, Agent, or Firm* — Tutunjian & Bitetto, P.C.; Robert Sullivan (57) ABSTRACT

A method of forming a complementary metal oxide semiconductor (CMOS) device is provided. The method includes forming a separate gate structure on each of a pair of vertical fins, wherein the gate structures include a gate dielectric layer and a gate metal layer, and forming a protective liner layer on the gate structures. The method further includes heat treating the pair of gate structures, and replacing the protective liner layer with an encapsulation layer. The method further includes exposing a portion of the gate dielectric layer by recessing the encapsulation layer. The method further includes forming a top source/drain on the top surface of one of the pair of vertical fins, and subjecting the exposed portion of the gate dielectric layer to a second heat treatment conducted in an oxidizing atmosphere.

15 Claims, 10 Drawing Sheets

(51) Int. Cl.
  *H01L 29/51*  (2006.01)
  *H01L 21/28*  (2006.01)
  *H01L 29/08*  (2006.01)
  *H01L 27/092*  (2006.01)
  *H01L 29/78*  (2006.01)
  *H01L 29/10*  (2006.01)
  *H01L 29/49*  (2006.01)

(52) U.S. Cl.
  CPC ............ *H01L 21/823814* (2013.01); *H01L 21/823885* (2013.01); *H01L 27/092* (2013.01); *H01L 29/0847* (2013.01); *H01L 29/1037* (2013.01); *H01L 29/4966* (2013.01); *H01L 29/517* (2013.01); *H01L 29/7827* (2013.01)

(58) Field of Classification Search
  CPC ..... H01L 21/823821; H01L 21/823828; H01L 21/823885; H01L 21/845
  See application file for complete search history.

(56) References Cited

U.S. PATENT DOCUMENTS

| | | | |
|---|---|---|---|
| 9,384,962 | B2 | 7/2016 | Hwang et al. |
| 9,449,887 | B2 | 9/2016 | Ando et al. |
| 9,466,492 | B2 | 10/2016 | Ando et al. |
| 9,799,570 | B1 | 10/2017 | Cheng |
| 10,002,962 | B2 | 6/2018 | Anderson et al. |
| 2016/0163603 | A1 | 6/2016 | Bao et al. |
| 2020/0058774 | A1* | 2/2020 | Yeh .................. H01L 29/42392 |

OTHER PUBLICATIONS

Cartier, et al., "p-FET Vt Control with HfO2/TiN/poly-Si Gate Stack Using a Lateral Oxygenation Process", 2009 Symposium on VLSI Technology Digest of Technical Papers, Jan. 2009, pp. 42-43.

* cited by examiner

METHOD OF FORMING A COMPLEMENTARY METAL OXIDE SEMICONDUCTOR DEVICE HAVING FIN FIELD EFFECT TRANSISTORS WITH A COMMON METAL GATE

BACKGROUND

The present invention generally relates complementary metal oxide semiconductor (CMOS) devices, and more particularly to CMOS devices having an n-type vertical transport fin field effect transistor (VT FinFET) device and a p-type vertical transport fin field effect transistor (VT FinFET) device.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOS-FET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a complementary metal oxide semiconductor (CMOS) device is provided. The method includes forming a separate gate structure on each of a pair of vertical fins, wherein the gate structures include a gate dielectric layer and a gate metal layer, and forming a protective liner layer on the gate structures. The method further includes heat treating the pair of gate structures, and replacing the protective liner layer with an encapsulation layer. The method further includes exposing a portion of the gate dielectric layer by recessing the encapsulation layer. The method further includes forming a top source/drain on the top surface of one of the pair of vertical fins, and subjecting the exposed portion of the gate dielectric layer to a second heat treatment conducted in an oxidizing atmosphere.

In accordance with another embodiment of the present invention, a method of forming a complementary metal oxide semiconductor (CMOS) device is provided. The method includes forming a separate gate structure on each of a pair of vertical fins, wherein the gate structures include a gate dielectric layer and a gate metal layer, and forming a protective liner layer on the gate structures. The method further includes heat treating the pair of gate structures, wherein the time and temperature of the heat treating is sufficient to shift the effective work function (EWF) of the gate metal layer to about 4.4 eV. The method further includes replacing the protective liner layer with an encapsulation layer, and exposing a portion of the gate dielectric layer by recessing the encapsulation layer. The method further includes forming a top source/drain on the top surface of one of the pair of vertical fins, and subjecting the exposed portion of the gate dielectric layer to a second heat treatment conducted in an oxidizing atmosphere that resets the effective work function of the gate structure with the expose gate dielectric layer to about 4.9 eV by passivating the oxygen vacancy formed in the gate dielectric layer.

In accordance with yet another embodiment of the present invention, a complementary metal oxide semiconductor (CMOS) device is provided. The CMOS device includes a first gate structure including a gate dielectric layer and a gate metal layer on a first vertical fin, wherein the gate metal layer of the first gate structure has an effective work function of about 4.4 eV; and a second gate structure including a gate dielectric layer and a gate metal layer on a second vertical fin, wherein the gate metal layer of the second gate structure has an effective work function of about 4.9 eV.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a complementary metal oxide semiconductor (CMOS) device having an n-type vertical transport fin field effect transistor device and a p-type vertical transport fin field effect transistor device with a common metal gate. Adjacent n-type and p-type vertical transport fin field effect transistor devices can be formed on a substrate, where both of the VT FinFETs have a gate metal layer made of the same material, but where one of the VT FinFETs has an effective work function (EWF) suitable for a p-type FinFET and the other VT FinFET has an effective work function suitable for an n-type FinFET.

Embodiments of the present invention provide a method of fabricating a complementary metal oxide semiconductor device having an n-type vertical transport fin field effect transistor device and a p-type vertical transport fin field effect transistor device with a common metal gate layer. The same gate metal layer can be formed on both of the adjacent vertical fins. A portion of the gate metal layer on a first vertical fin can have the effective work function adjusted to be suitable for an n-type FinFET using a first heat treatment, and a portion of the gate metal layer on a second vertical fin can be further adjusted using an oxidative heat treatment.

Embodiments of the present invention provide a method of adjusting the effective work function of a gate stack, including a high-k gate dielectric layer and transition metal nitride gate metal layer, by using the high-k gate dielectric layer as a conduit for an oxidative species during a heat treatment. By adjusting the effective work function of the gate metal layers, a change in the silicon dioxide leakage equivalent thickness ($T_{oxgl}$) can be reduced or avoided, and changes in the threshold voltage Vt and gate leakage can also be reduced or avoided.

Exemplary applications/uses to which the present invention can be applied include, but are not limited to: logic devices (e.g., NAND gates, NOR gates, etc.), memory devices (e.g., DRAM, SRAM, etc.), and low current devices (e.g., mobile devices).

It is to be understood that aspects of the present invention will be described in terms of a given illustrative architecture; however, other architectures, structures, substrate materials and process features and steps can be varied within the scope of aspects of the present invention.

Figure 1:
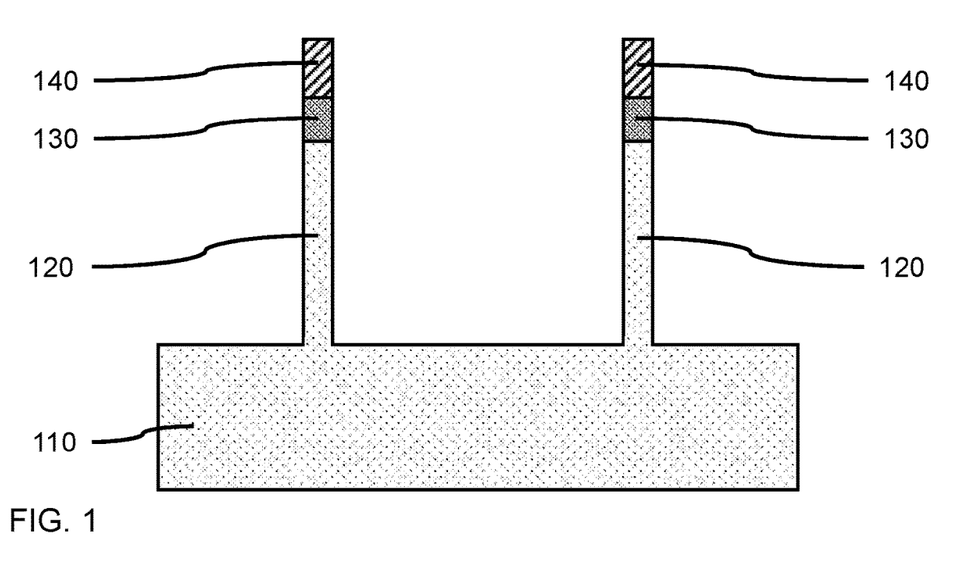
FIG. 1 is a cross-sectional side view showing a plurality of vertical fins formed on a substrate with a fin template and intervening semiconductor buffer layer segments on each vertical fin, in accordance with an embodiment of the present invention.

Referring now to the drawings in which like numerals represent the same or similar elements and initially to FIG. 1, a cross-sectional side view of a plurality of vertical fins formed on a substrate with a fin template and intervening semiconductor buffer layer segments on each vertical fin is shown, in accordance with an embodiment of the present invention.

In one or more embodiments, a substrate 110 can be, for example, a single crystal semiconductor material wafer or a semiconductor-on-insulator (SeOI) stacked wafer. The substrate 110 can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)) or a III-V semiconductor (e.g., gallium-arsenide (GaAs), indium-phosphide (InP), indium-antimonide (InSb)). In various embodiments, the substrate 110 can be a single crystal wafer.

In one or more embodiments, a plurality of vertical fins 120 can be formed on the substrate 110, where the vertical fins can be formed by an image transfer process or direct-write lithography process. In various embodiments, the image transfer process can be a sidewall image transfer (SIT) processes, for example, self-aligned single patterning (SASP), self-aligned double patterning (SADP), self-aligned triple patterning (SATP), or self-aligned quadruple patterning (SAQP). Direct write processes can utilize electron beam (EB), extreme ultraviolet (EUV), or x-ray lithography processes.

In various embodiments, a semiconductor buffer layer can be formed on the substrate 110 before forming the vertical fins 120, where the semiconductor buffer layer can be formed by an epitaxial or heteroepitaxial growth process. The semiconductor buffer layer can be a layer of silicon-germanium (SiGe) that can be an etch stop layer to provide tight control of the etch depth from the top surface of the vertical fin(s) 120, so the height of the exposed gate dielectric layer can be accurately defined.

In various embodiments, the semiconductor buffer layer and semiconductor buffer layer segments 130 can have a thickness in a rage of about 2 nanometers (nm) to about 15 nm, or about 4 nm to about 10 nm, although other thickness are also contemplated. The semiconductor buffer layer segments 130 can be a sacrificial layer that is removed before formation of top source/drains.

In various embodiments, a plurality of fin templates 140 can be formed from a fin template layer, as part of vertical fin formation process. The fin template layer and fin templates 140 can be a hardmask for etching the semiconductor buffer layer and substrate 110 to form the semiconductor buffer layer segments 130 and vertical fins 120, respectively.

In various embodiments, the vertical fins can have a width in a range of about 4 nm to about 12 nm, or about 6 nm to about 8 nm, although other widths are contemplated.

Figure 2:
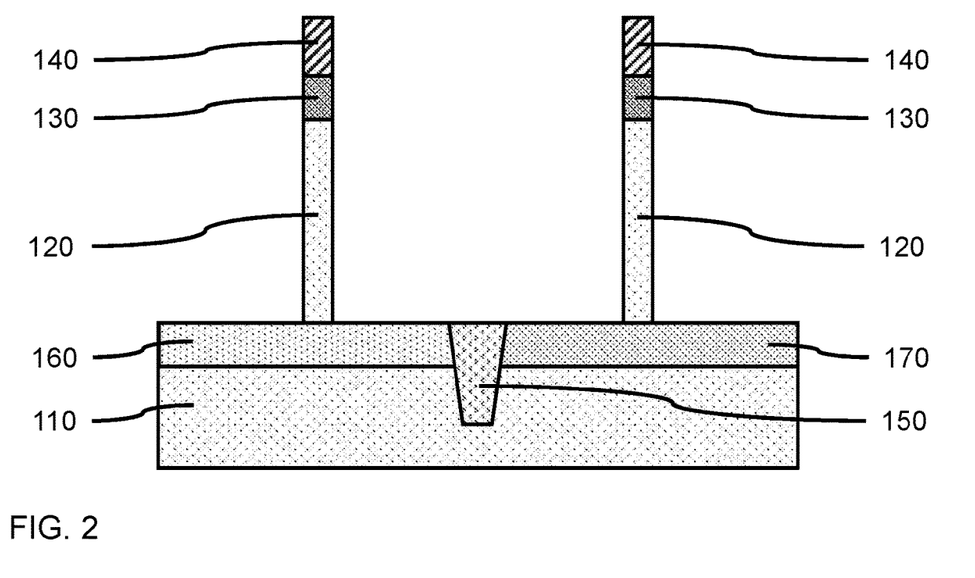
FIG. 2 is a cross-sectional side view showing a first bottom source/drain formed beneath one of the plurality of vertical fins and a second bottom source/drain formed beneath another of the plurality of vertical fins with an isolation region between the bottom source/drains, in accordance with an embodiment of the present invention.

FIG. 2 is a cross-sectional side view showing a first bottom source/drain formed beneath one of the plurality of vertical fins and a second bottom source/drain formed beneath another of the plurality of vertical fins with an isolation region between the bottom source/drains, in accordance with an embodiment of the present invention.

In one or more embodiments, a first bottom source/drain layer 160 can be formed on a substrate 110, where the first bottom source/drain layer 160 can be formed by implantation (e.g., ion beam implantation, diffusion doping, etc.) and/or an epitaxial or heteroepitaxial growth process, for example, molecular beam epitaxy (MBE), liquid phase epitaxy (LPE), or gas phase epitaxy (GPE). The first bottom source/drain layer 160 can be doped to be an n-type bottom source/drain layer or a p-type bottom source/drain layer, where the dopant(s) can be introduced in situ (i.e., during formation of a layer) or ex situ (i.e., after formation of a layer). In various embodiments, n-type dopants can be, for example, phosphorus (P) or arsenic (As), and p-type dopants can be, for example, boron (B) or gallium (Ga). In various embodiments, the first bottom source/drain layer 160 can be a semiconductor material, including, but not limited to n-type (e.g., P or As) doped silicon (Si) or p-type (e.g., B) doped silicon-germanium (SiGe). The first bottom source/drain layer 160 can be the same semiconductor material as the substrate or a different semiconductor material.

In various embodiments, the first bottom source/drain layer 160 can have a thickness in a range of about 10 nm to about 40 nm, or about 20 nm to about 30 nm, although other thicknesses are also contemplated.

In one or more embodiments, a second bottom source/drain layer 170 can be formed on a substrate 110, where the second bottom source/drain layer 170 can be formed by implantation (e.g., ion beam implantation, diffusion doping, etc.) and/or an epitaxial or heteroepitaxial growth process, for example, molecular beam epitaxy (MBE), liquid phase epitaxy (LPE), or gas phase epitaxy (GPE). The second bottom source/drain layer 170 can be doped to be an n-type bottom source/drain layer or a p-type bottom source/drain layer, where the second bottom source/drain layer 170 can have the opposite dopant type from the first bottom source/drain layer 160.

In various embodiments, the second bottom source/drain layer 170 can have a thickness in a range of about 10 nm to about 40 nm, or about 20 nm to about 30 nm, although other thicknesses are also contemplated. The second bottom source/drain layer 170 can have the same thickness as the first bottom source/drain layer 160.

In one or more embodiments, an isolation region 150 can be formed in the substrate 110, where the isolation region can be formed through the first bottom source/drain layer 160 and second bottom source/drain layer 170. The isolation region 150 can be formed by masking the vertical fins 120 and first and second bottom source/drain layers, and patterning the mask to expose portions of the substrate and/or first bottom source/drain layer 160 and/or second bottom source/drain layer 170. A directional etch, for example, a reactive ion etch (RIE) can be used to form an isolation trench in the substrate, where formation of the isolation trench can remove portions of the first bottom source/drain layer 160 and/or second bottom source/drain layer 170. The isolation trench can be filled with a suitable dielectric material, for example, silicon oxide (SiO), silicon nitride (SiN), or a low-k dielectric material. The isolation region 150 can physically and electrically separate the first bottom source/drain layer 160 from the second bottom source/drain layer 170. The top surface of the isolation region 150 can be coplanar with the top surfaces of the first and second bottom source/drain layers.

Figure 3:
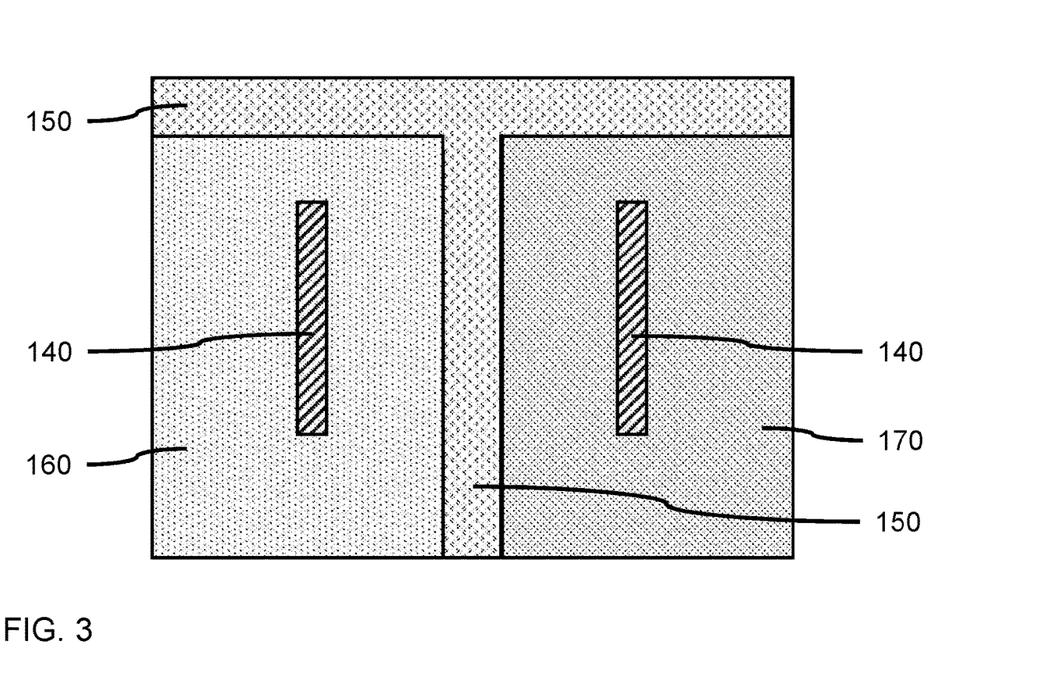
FIG. 3 is a top view showing the plurality of vertical fins separated by the isolation region, in accordance with an embodiment of the present invention.

FIG. 3 is a top view showing the plurality of vertical fins separated by the isolation region, in accordance with an embodiment of the present invention.

In one or more embodiments, the isolation region 150 can be between two directly adjacent vertical fins, and can be along an end of the adjacent vertical fins, so the vertical fins are electrically isolated from each other and other neighboring vertical fins.

In various embodiments, the isolation region 150 can have a width in a range of about 10 nm to about 200 nm, or about 10 nm to about 50 nm, although other widths are also contemplated.

Figure 4:
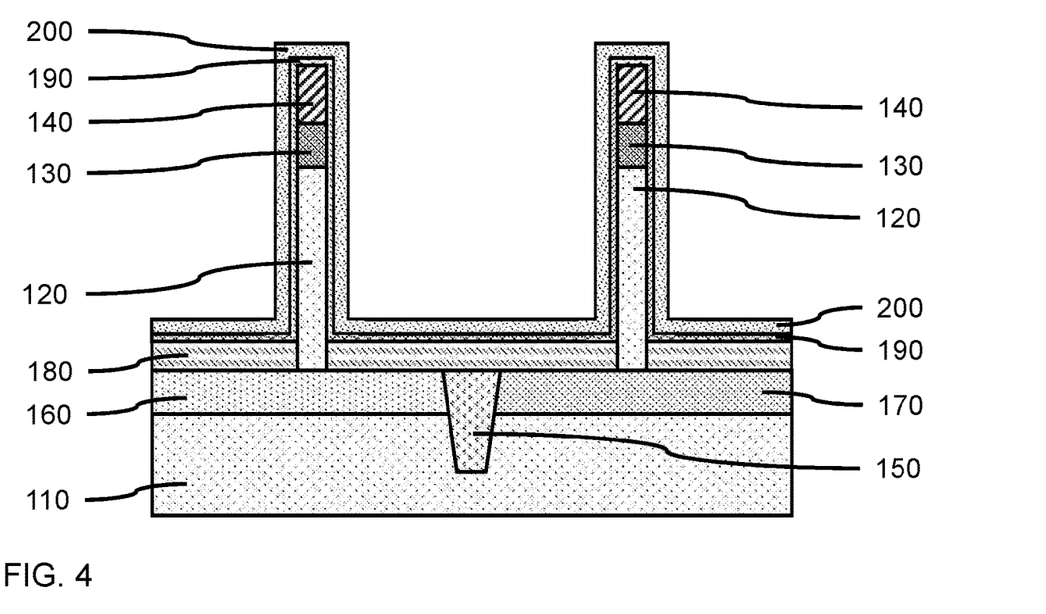
FIG. 4 is a cross-sectional side view showing a bottom spacer layer formed on the bottom source/drains and isolation region, and a common gate stack including a gate dielectric layer and a gate metal layer formed on the vertical fins and bottom spacer layer, in accordance with an embodiment of the present invention.

FIG. 4 is a cross-sectional side view showing a bottom spacer layer formed on the bottom source/drains and isolation region, and a common gate stack including a gate dielectric layer and a gate metal layer formed on the vertical fins and bottom spacer layer, in accordance with an embodiment of the present invention.

In one or more embodiments, a bottom spacer layer 180 can be formed on the isolation region 150 and the first bottom source/drain layer 160 and second bottom source/drain layer 170. The bottom spacer layer 180 can be formed by a directional deposition, for example, high density plasma (HDP) or gas cluster ion beam (GCIB), or a blanket deposition, for example, chemical vapor deposition (CVD) or plasma enhanced CVD (PECVD), and etched back to a predetermined height. The bottom spacer layer 180 can cover a lower portion of the vertical fins 120 up to the thickness of the bottom spacer layer.

In various embodiments, the bottom spacer layer 180 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. The bottom spacer layer 180 can be a material different from the fin templates to allow selective removal.

In one or more embodiments, a gate dielectric layer 190 can be formed on the bottom spacer layer 180 and the plurality of vertical fins 120, buffer layer segments 130, and fin templates 140, where the gate dielectric layer 190 can be formed by a conformal deposition, for example, atomic layer deposition (ALD), plasma enhanced ALD (PEALD), or low pressure CVD (LPCVD). The gate dielectric layer 190 can cover exposed surfaces of the bottom spacer layer 180, vertical fins 120, buffer layer segments 130, and fin templates 140.

In various embodiments, the gate dielectric layer 190 can be a high-k dielectric, including but not limited to, metal oxides, for example, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 190 can have a thickness in a range of about 1 nm to about 3 nm, or about 2 nm, although other thicknesses are also contemplated.

In one or more embodiments, a gate metal layer 200 can be formed on the gate dielectric layer 190, where the gate metal layer 200 can be formed by a conformal deposition, for example, atomic layer deposition (ALD) or plasma enhanced ALD (PEALD).

In various embodiments, the gate metal layer 200 can be a conducting transition metallic nitride or carbide compound material, for example, tantalum nitride (TaN), titanium nitride (TiN), tantalum carbide (TaC), titanium carbide (TiC), titanium aluminum carbide (TiAlC), and combinations thereof.

In various embodiments, the gate metal layer 200 can have a thickness in a range of about 2 nm to about 20 nm, or about 4 nm to about 10 nm, although other thicknesses are also contemplated.

The gate metal layer 200 and gate dielectric layer 190 can be formed over both vertical fins 140 at the same time to form the gate stacks, so the gate stacks have the same layer thicknesses and electrical properties. The gate dielectric layer 190 and the gate metal layer 200 can form a gate structure on each of the vertical fins 120.

Figure 5:
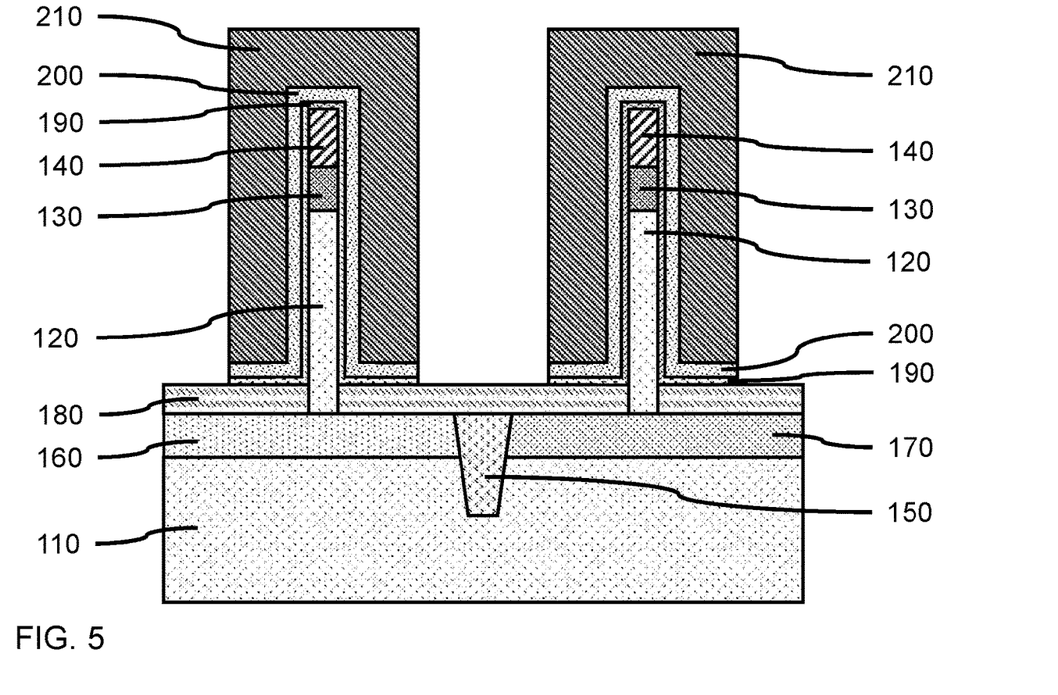
FIG. 5 is a cross-sectional side view showing a masking block over a portion of the gate stack on each of the vertical fins, in accordance with an embodiment of the present invention.

FIG. 5 is a cross-sectional side view showing a masking block over a portion of the gate stack on each of the vertical fins, in accordance with an embodiment of the present invention.

In one or more embodiments, a masking layer can be formed on the gate stacks and vertical fins 120 by a blanket deposition. The masking layer can be a dielectric hardmask material that can protect the covered gate metal layer 200 during etching. The masking layer can be patterned using lithographic techniques and etching to form a masking block 210 over each of the vertical fins 120 and portions of the gate metal layer 200 and gate dielectric layer 190. Portions of the gate metal layer 200 between and around the masking blocks 210 can be exposed.

In one or more embodiments, exposed portions of the gate metal layer 200 can be removed using a selective directional etch (e.g., RIE) to expose the underlying gate dielectric layer 190 between and around the masking blocks 210. Exposed portions of the gate dielectric layer 190 can be removed using a selective directional etch (e.g., RIE) to expose the underlying bottom spacer layer 180.

Figure 6:
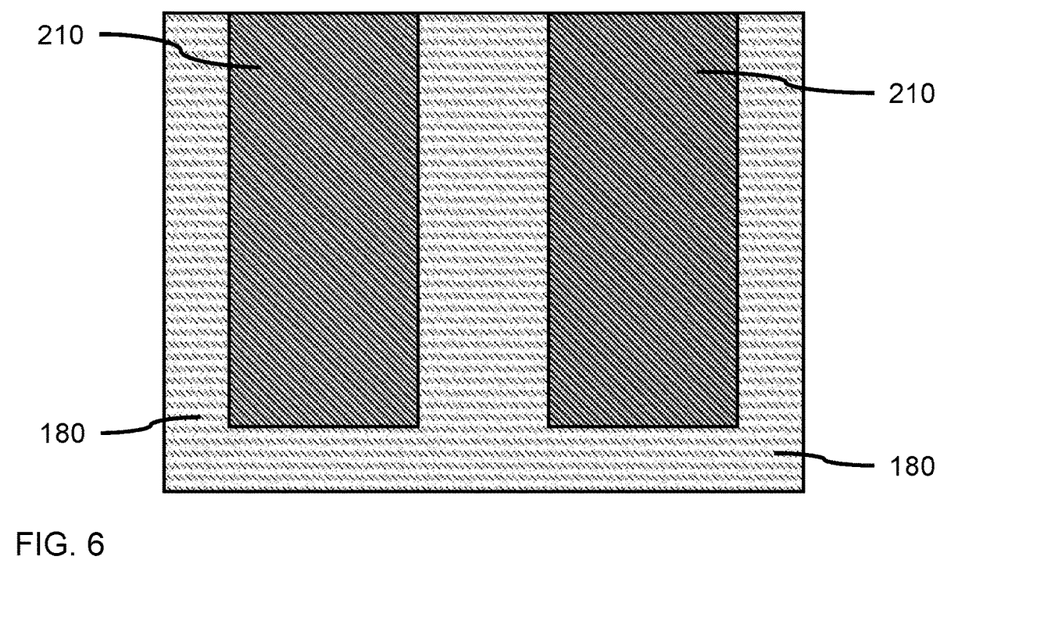
FIG. 6 is a top view showing a masking block over a portion of the gate stack on each of the vertical fins, in accordance with an embodiment of the present invention.

FIG. 6 is a top view showing a masking block over a portion of the gate stack on each of the vertical fins, in accordance with an embodiment of the present invention.

In various embodiments, portions of the bottom spacer layer 180 can be exposed between and around the masking blocks 210. The masking blocks can extend beyond the length of the vertical fins 120.

Figure 7:
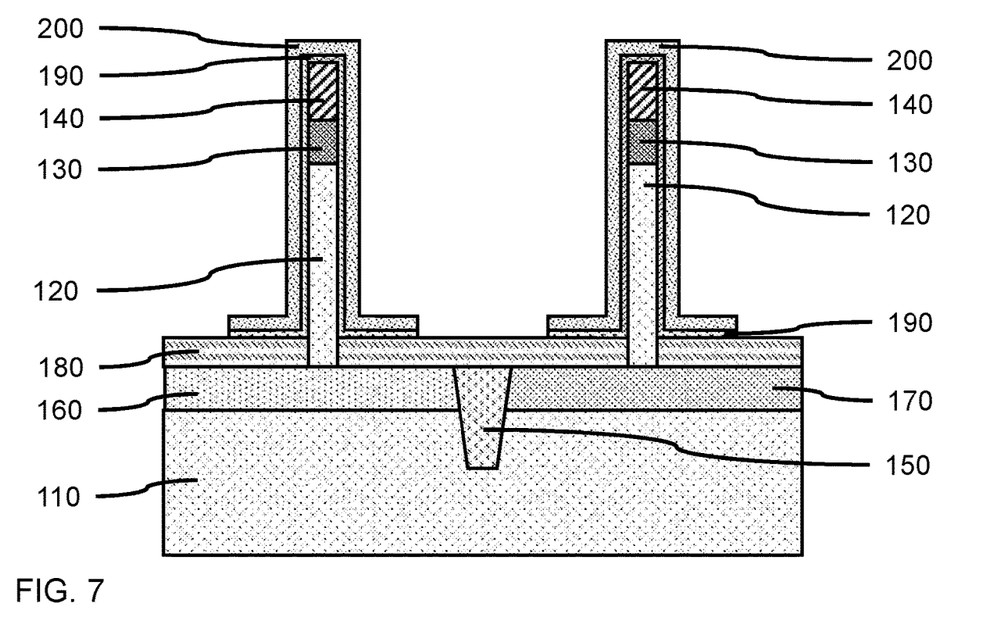
FIG. 7 is a cross-sectional side view showing the gate stacks on the vertical fins trimmed back using the masking blocks, where a portion of the gate stack is removed from between the vertical fins, in accordance with an embodiment of the present invention.

FIG. 7 is a cross-sectional side view showing the masking blocks removed from the trimmed gate stacks, in accordance with an embodiment of the present invention.

In one or more embodiments, the masking blocks 210 can be removed using an isotropic etch, for example, a wet chemical etch or dry plasma etch to expose the trimmed gate stacks.

Figure 8:
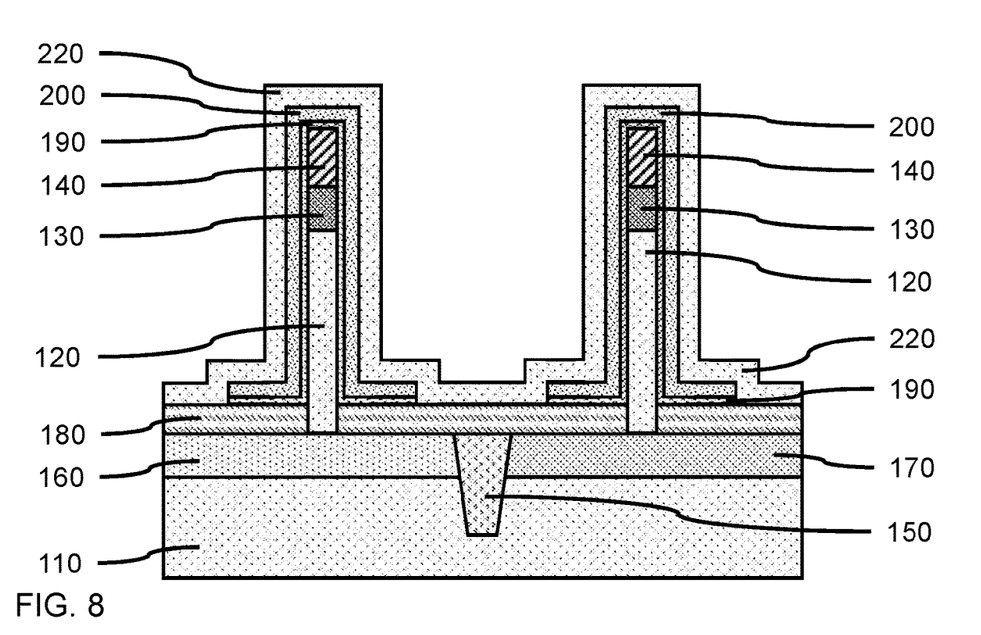
FIG. 8 is a cross-sectional side view showing a protective liner layer over the remaining portions of the gate stacks, where a portion of the protective liner layer is between the vertical fins, in accordance with an embodiment of the present invention.

FIG. 8 is a cross-sectional side view showing a protective liner layer over the remaining portions of the gate stacks, where a portion of the protective liner layer is between the vertical fins, in accordance with an embodiment of the present invention.

In one or more embodiments, a protective liner layer 220 can be formed on the exposed surface of the gate metal layer 200 and bottom spacer layer 180, where the protective liner layer 220 can be formed by a conformal deposition (e.g., ALD, PEALD). In various embodiments, the protective liner layer 220 can be a semiconductor material, for example, amorphous silicon (a-Si) that can reduce or prevent diffusion of oxygen and other oxidizing species in to the gate metal layer.

In various embodiments, the protective liner layer 220 can have a thickness in a range of about 3 nm to about 20 nm, or about 5 nm to about 10 nm, where the protective liner layer 220 is sufficiently thick to protect the gate metal layer 200 and gate dielectric layer 190 from oxygen during a subsequent heat treatment.

Figure 9:
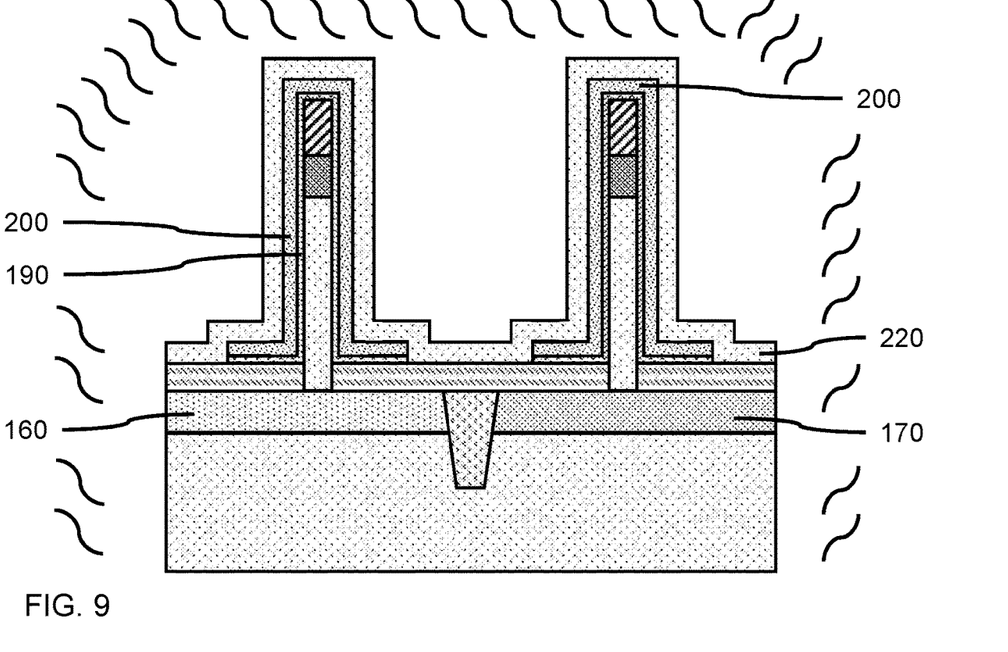
FIG. 9 is a cross-sectional side view showing a heat treatment of the protective liner layer and the remaining portions of the gate stacks to adjust the effect work functions of the gate metal layer, in accordance with an embodiment of the present invention.

FIG. 9 is a cross-sectional side view showing a heat treatment of the protective liner layer and the remaining portions of the gate stacks to adjust the effect work functions of the gate metal layer, in accordance with an embodiment of the present invention.

In one or more embodiments, the protective liner layer 220 and underlying gate metal layer 200 and gate dielectric layer 190 can be heat treated, for example, by a spike anneal or a soak anneal. The heat treatment can reset the effective work function (EWF) of the gate structures.

In various embodiments, the heat treatment can be conducted at a temperature in a range of about 700° C. to about 1100° C., or about 800° C. to about 1000° C., although other temperatures are also contemplated. In various embodiments, the heat treatment can be conducted for a time period in a range of about 0.1 seconds (sec) to about 10 sec, or about 1 sec to about 5 sec, where the temperature and time period is sufficient to shift the effective work function (EWF) of the gate metal layer 200 to about 4.4 eV (i.e., +/−0.1 eV). An EWF of about 4.4 eV can be suitable for an n-type field effect transistor device.

Figure 10:
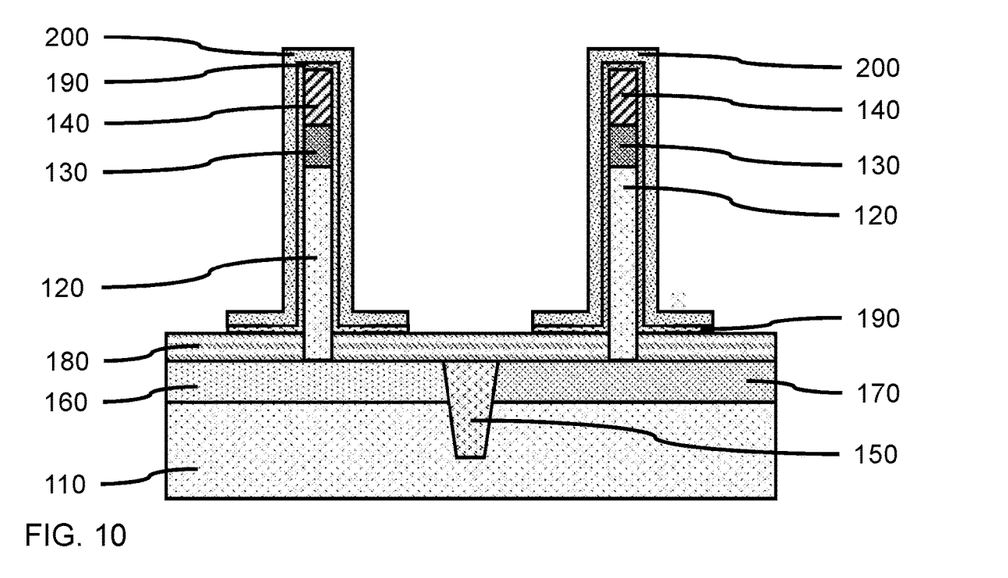
FIG. 10 is a cross-sectional side view showing the removal of the protective liner layer from the gate stacks, in accordance with an embodiment of the present invention.

FIG. 10 is a cross-sectional side view showing the removal of the protective liner layer from the gate stacks, in accordance with an embodiment of the present invention.

In one or more embodiments, the protective liner layer 220 can be removed to expose the gate metal layer 200 after the heat treatment. The protective liner layer 220 can be removed using a selective isotropic etch that exposes the bottom spacer layer 180.

Figure 11:
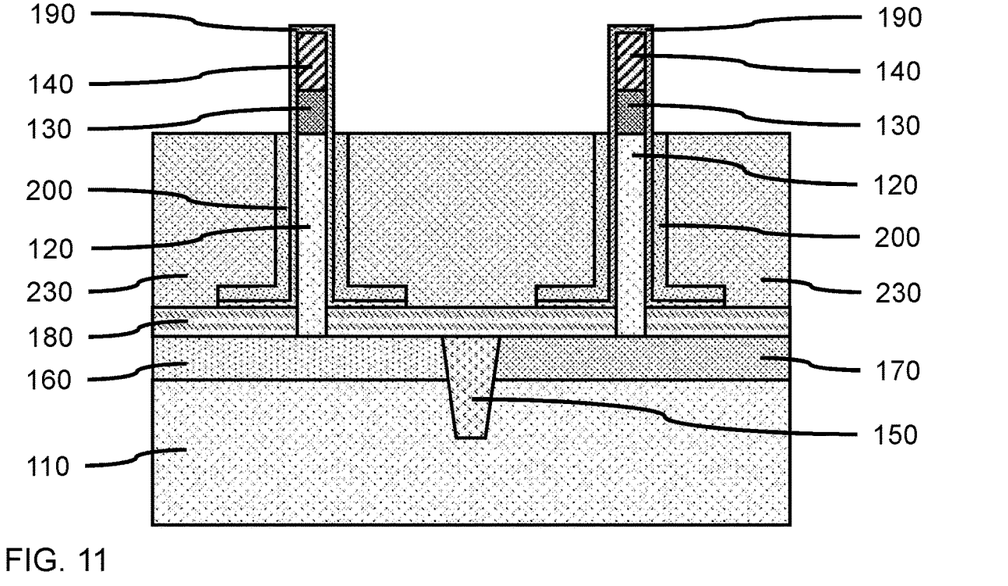
FIG. 11 is a cross-sectional side view showing a planarization layer formed on the gate stacks, where the planarization layer is recessed, and exposed portions of the gate metal layer are removed to expose the underlying portions of the gate dielectric layer, in accordance with an embodiment of the present invention.

FIG. 11 is a cross-sectional side view showing a planarization layer formed on the gate stacks, where the planarization layer is recessed, and exposed portions of the gate metal layer are removed to expose the underlying portions of the gate dielectric layer, in accordance with an embodiment of the present invention.

In one or more embodiments, a planarization layer 230 can be formed on the gate stacks and vertical fins 120. The planarization layer 230 can be formed by a spin-on process. The planarization layer 230 can be a developable organic planarization layer, which can be a photo-sensitive organic polymer, including, but not limited to, polyacrylate resin, epoxy resin, phenol resin, polyamide resin, polyimide resin, unsaturated polyester resin, polyphenylenether resin, polyphenylenesulfide resin, or a combination thereof.

In one or more embodiments, the height of the planarization layer 230 can be adjusted to expose an upper portion of the gate metal layer 200. In various embodiments, the height of the planarization layer 230 can be positioned at about the bottom surface of the semiconductor buffer layer segment 130 to control the effective gate length of a vertical transport fin field effect transistor device.

In one or more embodiments, the exposed portion(s) of the gate metal layer 200 can be removed using a selective isotropic etch to expose the underlying portion(s) of the gate dielectric layer 190.

Figure 12:
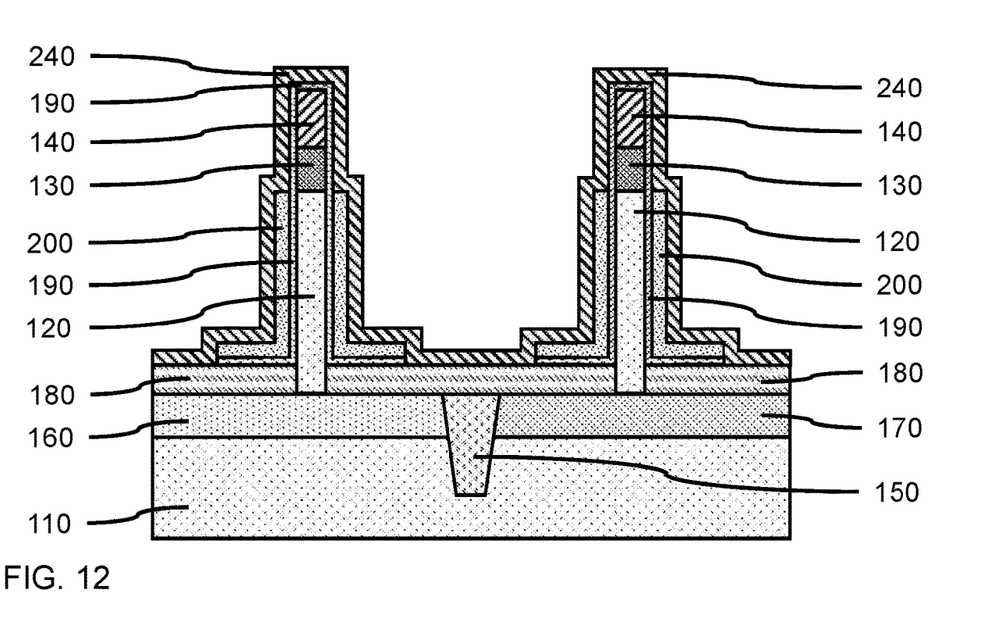
FIG. 12 is a cross-sectional side view showing the planarization layer removed from the gate stacks and an encapsulation layer formed on the remaining portions of the gate stacks, in accordance with an embodiment of the present invention.

FIG. 12 is a cross-sectional side view showing the planarization layer removed from the gate stacks and an encapsulation layer formed on the remaining portions of the gate stacks, in accordance with an embodiment of the present invention.

In one or more embodiments, the planarization layer 230 can be removed from the gate stacks using a selective, isotropic etch.

In one or more embodiments, an encapsulation layer 240 can be formed on the remaining portions of the gate metal layer 200 and exposed portions of the gate dielectric layer 190 and bottom spacer layer 180. The encapsulation layer 240 can be formed using a conformal deposition.

In various embodiments, the encapsulation layer 240 can be a dielectric material, including, but not limited to, silicon oxide (SiO), silicon nitride (SiN), silicon oxynitride (SiON), silicon boro carbonitride (SiBCN), a low-k dielectric material (e.g., carbon doped silicon oxide (SiO:C)), or a combination thereof.

In various embodiments, the encapsulation layer 240 can have a thickness in a range of about 4 nm to about 15 nm, or about 6 nm to about 10 nm, although other thicknesses are also contemplated. The encapsulation layer 240 can be suitably thick to protect the gate metal layer 200 from downstream processing steps.

Figure 13:
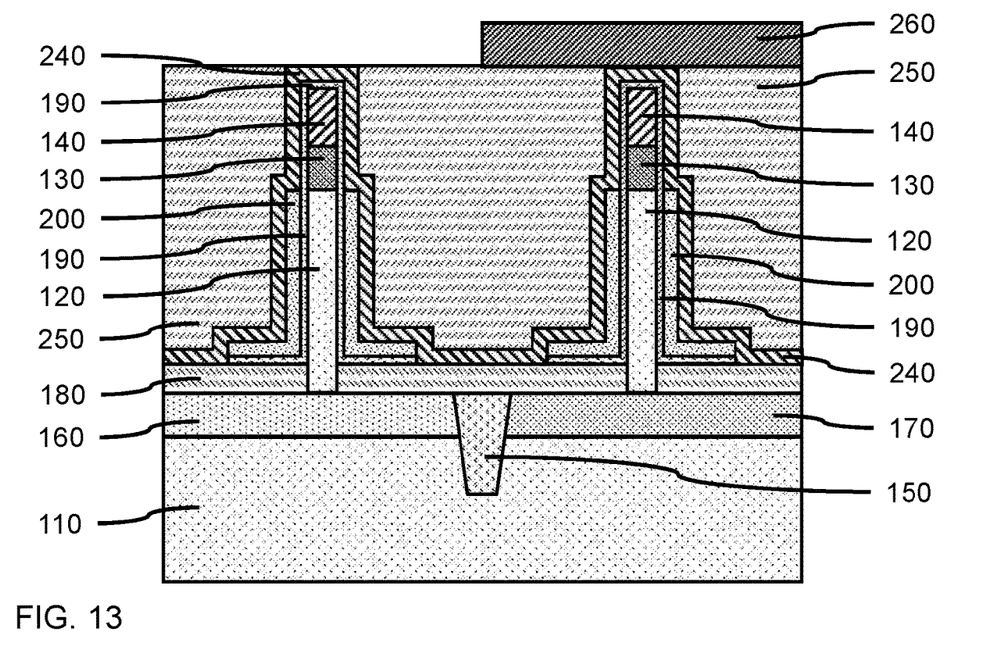
FIG. 13 is a cross-sectional side view showing a fill layer formed on the encapsulation layer and gate stacks, and a first masking template formed over one of the gate stacks, in accordance with an embodiment of the present invention.

FIG. 13 is a cross-sectional side view showing a fill layer formed on the encapsulation layer and gate stacks, and a first masking template formed over one of the gate stacks, in accordance with an embodiment of the present invention.

In one or more embodiments, a fill layer 250 can be formed on the encapsulation layer 240, where the fill layer can be formed by a blanket deposition.

In various embodiments, the fill layer 250 can be a dielectric material, including, but not limited to, silicon oxide (SiO), silicon nitride (SiN), silicon oxynitride (SiON), silicon boro carbonitride (SiBCN), a low-k dielectric material (e.g., carbon doped silicon oxide (SiO:C)), or a combination thereof.

In one or more embodiments, a masking template 260 can be formed over a gate stack and vertical fin 120, where the masking template 260 can be formed by lithographic processes.

Figure 14:
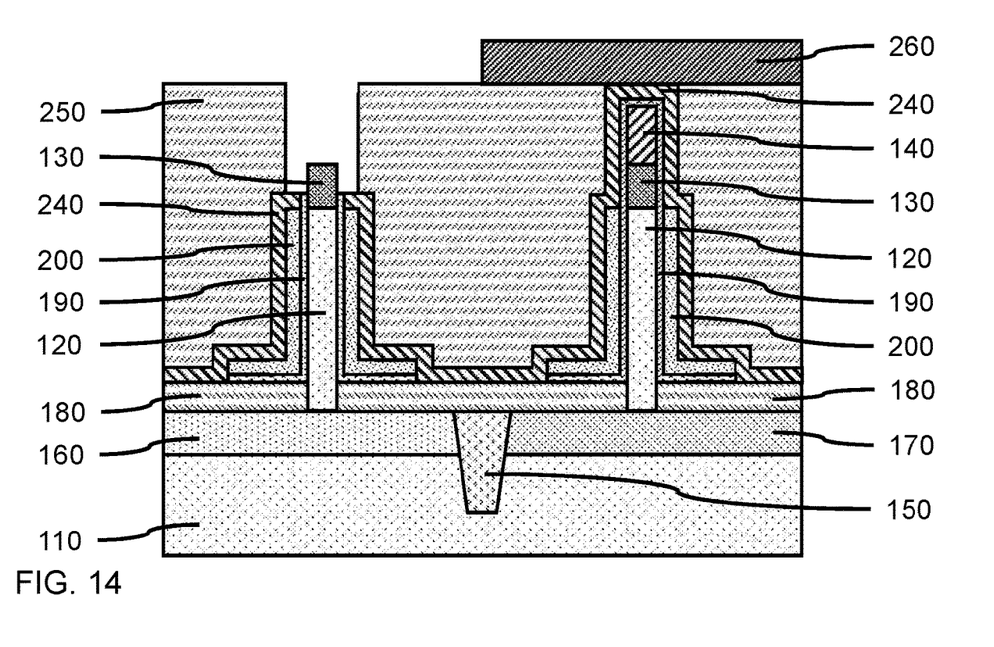
FIG. 14 is a cross-sectional side view showing a portion of the encapsulation layer and a portion of the gate dielectric layer removed to expose the fin template, and removal of the fin template to expose the semiconductor buffer layer segment on the vertical fin, in accordance with an embodiment of the present invention.

FIG. 14 is a cross-sectional side view showing a portion of the encapsulation layer and a portion of the gate dielectric layer removed to expose the fin template, and removal of the fin template to expose the semiconductor buffer layer segment on the vertical fin, in accordance with an embodiment of the present invention.

In one or more embodiments, a top surface of the encapsulation layer 240 can be exposed. A selective, isotropic etch can be used to remove a portion of the encapsulation layer 240 on the fin template 140 and an upper portion of the semiconductor buffer layer segments 130. Removal of the encapsulation layer 240 can expose the underlying portion of the gate dielectric layer 190. The encapsulation layer 240 can still cover the gate metal layer 200.

In one or more embodiments, the exposed portion of the gate dielectric layer 190 can be removed using a selective isotropic etch to expose the fin template 140 and upper portion of the semiconductor buffer layer segments 130. The fin template 140 can be removed using a selective, isotropic etch.

Figure 15:
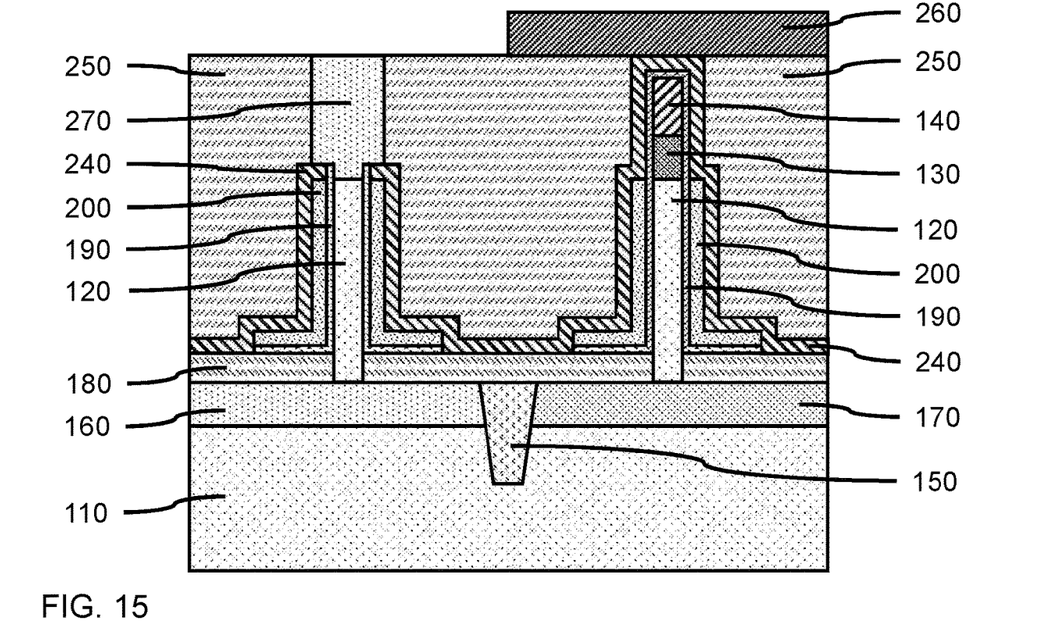
FIG. 15 is a cross-sectional side view showing removal of the semiconductor buffer layer segment to expose the top surface of the vertical fin, and a top source/drain formed on the exposed vertical fin, in accordance with an embodiment of the present invention.

FIG. 15 is a cross-sectional side view showing removal of the semiconductor buffer layer segment to expose the top surface of the vertical fin, and a top source/drain formed on the exposed vertical fin, in accordance with an embodiment of the present invention.

In one or more embodiments, the semiconductor buffer layer segments 130 can be removed using a selective, isotropic etch to expose the top surface of the vertical fin 120.

In one or more embodiments, a top source/drain 270 can be formed on the top surface of the vertical fin 120, where the top source/drain can be formed by epitaxial growth. The top source/drain 270 can be a semiconductor material that can be doped to form an n-type or p-type top source/drain. The top source/drain 270 can be the same semiconductor material as the bottom source/drain 160, and can include the same dopant type to form an n-type or p-type device.

Figure 16:
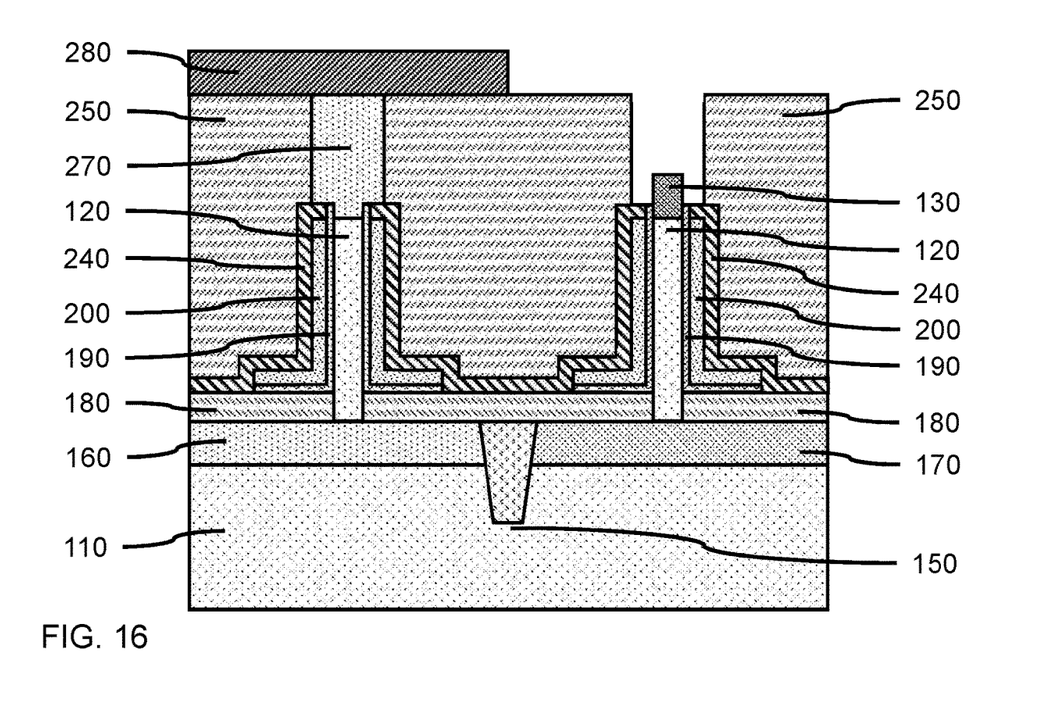
FIG. 16 is a cross-sectional side view showing the first masking template removed and a second masking template formed on the fill layer and top source/drain, a portion of the encapsulation layer and a portion of the gate dielectric layer removed to expose the other fin template, and removal of the fin template to expose the semiconductor buffer layer segment on the other vertical fin, in accordance with an embodiment of the present invention.

FIG. 16 is a cross-sectional side view showing the first masking template removed and a second masking template formed on the fill layer and top source/drain, a portion of the encapsulation layer and a portion of the gate dielectric layer removed to expose the other fin template, and removal of the fin template to expose the semiconductor buffer layer segment on the other vertical fin, in accordance with an embodiment of the present invention.

In one or more embodiments, the first masking template 260 can be removed and a second masking template 280 can be formed on the fill layer 250 and top source/drain 270.

In one or more embodiments, a top surface of the encapsulation layer 240 can be exposed. A selective, isotropic etch can be used to remove a portion of the encapsulation layer 240 on the fin template 140 and an upper portion of the semiconductor buffer layer segments 130. Removal of the encapsulation layer 240 can expose the underlying portion of the gate dielectric layer 190. The encapsulation layer 240 can still cover the gate metal layer 200.

In one or more embodiments, the exposed portion of the gate dielectric layer 190 can be removed using a selective isotropic etch to expose the fin template 140 and upper portion of the semiconductor buffer layer segments 130. The fin template 140 can be removed using an isotropic etch. The semiconductor buffer layer segments 130 can remain on the vertical fin 120.

Figure 17:
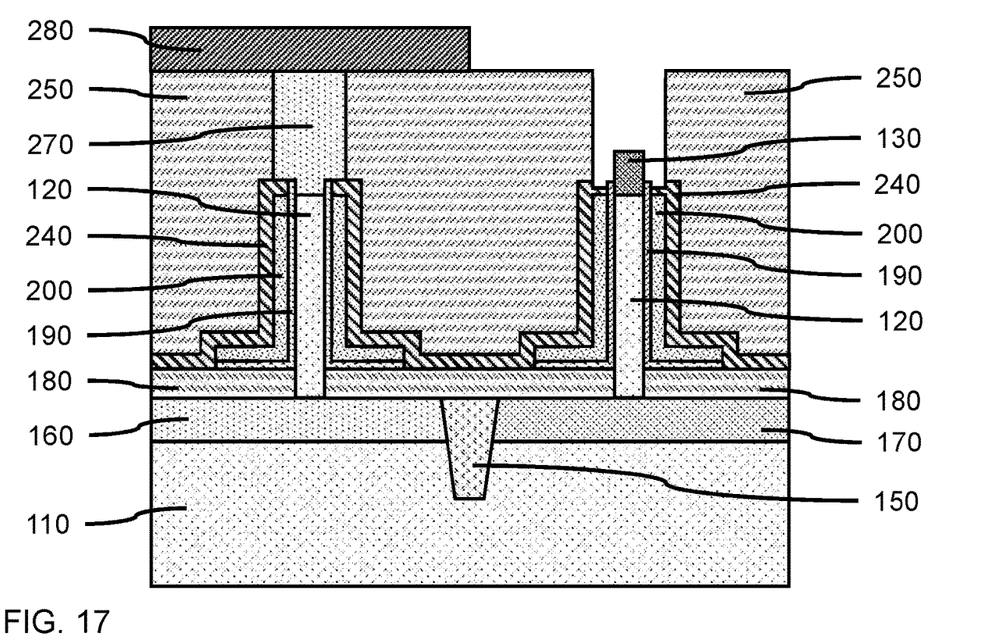
FIG. 17 is a cross-sectional side view showing the partial removal of the exposed encapsulation layer to expose a portion of the gate dielectric sidewalls, in accordance with an embodiment of the present invention.

FIG. 17 is a cross-sectional side view showing the partial removal of the exposed encapsulation layer to expose a portion of the gate dielectric sidewalls, in accordance with an embodiment of the present invention.

In one or more embodiments, the exposed portion of the encapsulation layer 240 can be etched back using a selective directional etch (e.g., RIE) to expose a portion of the gate dielectric layer 190 on the semiconductor buffer layer segments 130. The encapsulation layer 240 can be etched back to expose a greater surface area of the gate dielectric layer 190, so that oxygen can diffuse into the gate dielectric layer 190 and change the effective work function (EWF) of the gate metal layer 200. The gate dielectric layer of a pFET can be reset to an initial EWF that was previously altered by preceding processing steps, including the heat treatment. With the partial removal of the exposed encapsulation layer, the top source/drain shape can be different from that of the nFET, and the gate dielectric layer remains exposed after formation of the pFET top source/drain.

In various embodiments, the encapsulation layer 240 can be etched back about 3 nm to about 6 nm, where the remaining portion of the encapsulation layer 240 can have a thickness on the gate metal layer 200 in a range of about 3 nm to about 9 nm, although other thicknesses are also contemplated.

Figure 18:
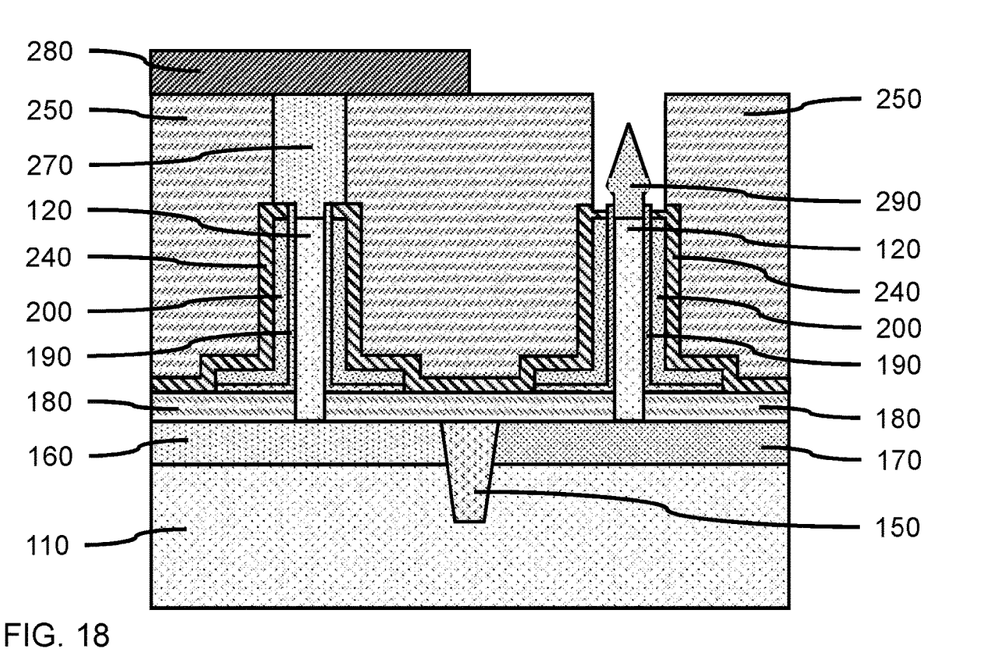
FIG. 18 is a cross-sectional side view showing removal of the semiconductor buffer layer segment to expose the top surface of the other vertical fin, and a top source/drain formed on the exposed vertical fin, in accordance with an embodiment of the present invention.

FIG. 18 is a cross-sectional side view showing removal of the semiconductor buffer layer segment to expose the top surface of the other vertical fin, and a top source/drain formed on the exposed vertical fin, in accordance with an embodiment of the present invention.

In one or more embodiments, the semiconductor buffer layer segments 130 can be removed using a selective isotropic etch to expose the top surface of the vertical fin 120. Removal of the semiconductor buffer layer segments 130 can expose additional surface area of the gate dielectric layer 190, which can act as a conduit for an oxidizing species.

In one or more embodiments, a top source/drain 290 can be formed on the top surface of the vertical fin 120, where the top source/drain can be formed by epitaxial growth. The top source/drain 290 can be a semiconductor material that can be doped to form an n-type or p-type top source/drain. The top source/drain 290 can be the same semiconductor material as the bottom source/drain 170. The top source/drain 290 can have the opposite dopant type from the top source/drain 270, so an n-type FinFET and a p-type FinFET are fabricated adjacent to each other.

Figure 19:
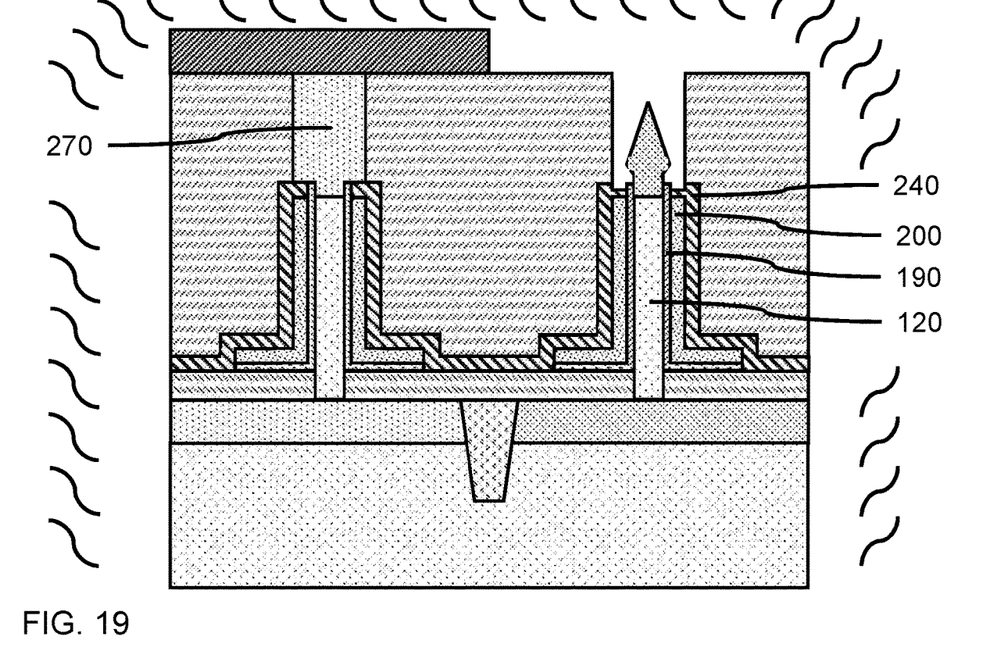
FIG. 19 is a cross-sectional side view showing a second heat treatment of the exposed gate dielectric layer and the vertical fins, in accordance with an embodiment of the present invention.

FIG. 19 is a cross-sectional side view showing a second heat treatment of the exposed gate dielectric layer and the vertical fins, in accordance with an embodiment of the present invention.

In one or more embodiments, a second heat treatment of the exposed gate dielectric layer 190 and the vertical fins 120 can be conducted.

In various embodiments, the second heat treatment can be conducted at a temperature in a range of about 200° C. to about 500° C., or about 300° C. to about 400° C., although other temperatures are also contemplated. The heat treatment can be conducted in an oxidizing atmosphere that provides oxygen to the gate dielectric layer, which is exposed, so that the effective work function of the gate structure can be reset to about 4.9 eV (i.e., +/−0.1 eV) by passivating the oxygen vacancies formed in the gate dielectric layer 190 in the previous heat treatment.

In various embodiments, the heat treatment can be conducted in an atmosphere including an oxidizing species, for example, oxygen ($O_2$), ozone ($O_3$), or a combination thereof, with an unreactive carrier gas, for example, nitrogen ($N_2$), helium (He), argon (Ar), and combinations thereof. In various embodiments, the oxidizing species can be at a partial pressure in a range of about 0.01 atmosphere (atm) to about 20 atm, or about 0.1 atm to about 1 atm, although other pressures are also contemplated.

In various embodiments, the heat treatment can be conducted for a time period in a range of about 10 seconds (sec) to about 1000 sec, or about 30 sec to about 300 sec, where the temperature and time period with the oxidizing species is sufficient to shift the effective work function (EWF) of the gate metal layer 200 to about 4.9 eV (i.e., +/−0.1 eV). An EWF of about 4.9 eV can be suitable for a p-type field effect transistor device.

Figure 20:
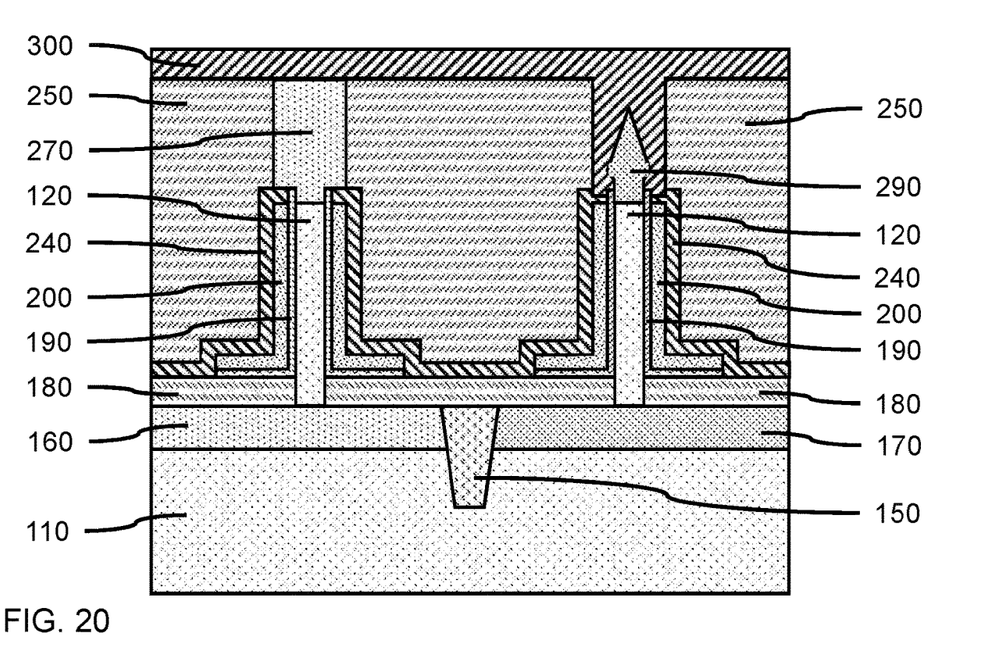
FIG. 20 is a cross-sectional side view showing a capping layer formed on the top source/drains and fill layer, in accordance with an embodiment of the present invention.

FIG. 20 is a cross-sectional side view showing a capping layer formed on the top source/drains and fill layer, in accordance with an embodiment of the present invention.

In one or more embodiments, a capping layer 300 can be formed on the top source/drains 270, 290 and fill layer 250. The capping layer 300 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. The capping layer 300 can be the same dielectric material as the encapsulation layer 240.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments acrd is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not, preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a complementary metal oxide semiconductor (CMOS) device, comprising:
    forming a separate gate structure on each of a pair of vertical fins, wherein the gate structures include a gate dielectric layer and a gate metal layer;
    forming a protective liner layer on the gate structures;
    heat treating the pair of gate structures;
    replacing the protective liner layer with an encapsulation layer;
    exposing a portion of the gate dielectric layer by recessing the encapsulation layer;
    forming a top source/drain on the top surface of one of the pair of vertical fins; and
    subjecting the exposed portion of the gate dielectric layer to a second heat treatment conducted in an oxidizing atmosphere.

2. The method of claim 1, wherein the gate dielectric layer is a high-k dielectric metal oxide.

3. The method of claim 2, wherein the gate dielectric layer is hafnium oxide (HfO).

4. The method of claim 3, wherein the encapsulation layer is a dielectric material selected from the group consisting of silicon oxide (SiO), silicon nitride (SiN), silicon oxynitride (SiON), silicon boro carbonitride (SiBCN), and combinations thereof.

5. The method of claim 3, wherein the protective liner layer is a semiconductor material that can reduce or prevent diffusion of oxygen and other oxidizing species.

6. The method of claim 5, wherein the protective liner layer is amorphous silicon (a-Si).

7. The method of claim 1, wherein heat treating the pair of gate structures is conducted at a temperature in a range of about 700° C. to about 1100° C.

8. The method of claim 7, wherein the heat treating the pair of gate structures is conducted for a time period in a range of about 0.1 seconds (sec) to about 10 sec, wherein the time and temperature of the heat treating is sufficient to shift the effective work function (EWF) of the gate metal layer to about 4.4 eV.

9. The method of claim 7, wherein the second heat treatment is conducted at a temperature in a range of about 200° C. to about 500° C. that resets the effective work function of the gate structure with the expose gate dielectric layer to about 4.9 eV by passivating the oxygen vacancy formed in the gate dielectric layer.

10. A method of forming a complementary metal oxide semiconductor (CMOS) device, comprising:
    forming a separate gate structure on each of a pair of vertical fins, wherein the gate structures include a gate dielectric layer and a gate metal layer;
    forming a protective liner layer on the gate structures;
    heat treating the pair of gate structures, wherein the time and temperature of the heat treating is sufficient to shift the effective work function (EWF) of the gate metal layer to about 4.4 eV;
    replacing the protective liner layer with an encapsulation layer;
    exposing a portion of the gate dielectric layer by recessing the encapsulation layer;
    forming a top source/drain on the top surface of one of the pair of vertical fins; and
    subjecting the exposed portion of the gate dielectric layer to a second heat treatment conducted in an oxidizing atmosphere that resets the effective work function of the gate structure with the expose gate dielectric layer to about 4.9 eV by passivating the oxygen vacancy formed in the gate dielectric layer.

11. The method of claim 10, wherein the gate metal layer is a conducting transition metallic nitride or carbide compound material selected from the group consisting of tantalum nitride (TaN), titanium nitride (TiN), tantalum carbide (TaC), titanium carbide (TiC), titanium aluminum carbide (TiAlC), and combinations thereof.

12. The method of claim 11, wherein the gate dielectric layer is hafnium oxide (HfO).

13. The method of claim 12, wherein heat treating the pair of gate structures is conducted at a temperature in a range of about 800° C. to about 1000° C.

14. The method of claim 13, wherein the second heat treatment is conducted at a temperature in a range of about 300° C. to about 400° C.

15. The method of claim 14, wherein the oxidizing species is selected from the group consisting of oxygen ($O_2$), ozone ($O_3$), and combinations thereof.

* * * * *